US011415610B2

(12) United States Patent
Mayrhofer

(10) Patent No.: US 11,415,610 B2
(45) Date of Patent: Aug. 16, 2022

(54) VALIDATION OF PHASE CURRENTS IN A MULTI-PHASE SYSTEM

(71) Applicant: B&R INDUSTRIAL AUTOMATION GMBH, Eggelsberg (AT)

(72) Inventor: Andreas Mayrhofer, Eggelsberg (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 40 days.

(21) Appl. No.: 17/105,926

(22) Filed: Nov. 27, 2020

(65) Prior Publication Data

US 2021/0165025 A1 Jun. 3, 2021

(30) Foreign Application Priority Data

Nov. 29, 2019 (AT) .............................. A 51044/2019

(51) Int. Cl.
*G01R 25/00* (2006.01)
*H02H 3/26* (2006.01)
(52) U.S. Cl.
CPC ........... *G01R 25/005* (2013.01); *H02H 3/265* (2013.01)
(58) Field of Classification Search
CPC .. G01R 25/005; G01R 19/0092; G01R 29/16; G01R 31/34; G01R 19/10; G01R 19/0038; G01R 19/25; H02H 3/265; H02P 23/14

USPC .................................. 324/76.77, 76.11, 200
See application file for complete search history.

(56) References Cited

U.S. PATENT DOCUMENTS

| 10,060,983 | B2 | 8/2018 | Mayrhofer |
| 2018/0102719 | A1* | 4/2018 | Oka .......................... H02P 6/12 |
| 2019/0173414 | A1* | 6/2019 | Qiu .......................... H02P 29/64 |
| 2020/0136524 | A1* | 4/2020 | Chen ..................... H02M 5/297 |

FOREIGN PATENT DOCUMENTS

EP         3 109 999        12/2016

* cited by examiner

*Primary Examiner* — Giovanni Astacio-Oquendo
(74) *Attorney, Agent, or Firm* — Greenblum & Bernstein, P.L.C.

(57) ABSTRACT

In order to ensure safe operation of a multi-phase system, even a system including a plurality of phases, a number of phase groups is provided, which comprises some of the phases, wherein phase currents of the number of phase groups are merged in a group node to form a group sum current and a group sum current measurement value of the group sum current is captured. The current measurement values belonging to the number of phase groups are summed up to form a group sum and the group sum is compared with the group sum current measurement value to validate the phase currents of the phases in order to ensure safe operation.

10 Claims, 3 Drawing Sheets

VALIDATION OF PHASE CURRENTS IN A MULTI-PHASE SYSTEM

CROSS-REFERENCE TO RELATED APPLICATIONS

The present application claims priority under 35 U.S.C. § 119(a) of Austria Application No. A51044/2019 filed Nov. 29, 2019, the disclosure of which is expressly incorporated by reference herein in its entirety.

The present invention relates to a method for safely operating a multi-phase system, in which method a phase current flows in each of a plurality of phases of the multi-phase system, and current measurement values of the phase currents are captured by phase current sensors in order to validate the phase currents. Furthermore, the present invention relates to a multi-phase system comprising a plurality of phases, a phase current flowing in each phase, current sensors being provided for capturing current measurement values of the phase currents In multi-phase systems, for example electromagnetic transport units, such as long stator linear motors or planar motors, phase currents of the individual phases are determined. To ensure that no errors occur when determining or processing the phase currents, it is often desirable to validate the phase currents, i.e. to ensure that the determined phase currents are correct. One option for validating the determined phase currents is to use Kirchoff's rule of the sum of currents. According to Kirchhoff's first law, the sum of all currents in a node equals zero. In other words, the sum of all currents flowing into a node corresponds to the sum of all currents flowing out of the node. Accordingly, in order to validate the phase currents, the phase currents can be merged into a common node to form a phase current sum and the phase current sum can be determined. If the determined phase current sum in the node corresponds to the sum of the individually determined phase currents, the phase currents can be validated, which means that the measurement of the phase currents is to be considered as valid. EP 3 109 999 A2 discloses such a method for validating the phase currents of a multi-phase system.

When determining the individual phase currents, however, a permissible tolerance, i.e. a maximum permissible error, must be taken into account in each case. However, an error occurring in a phase, e.g. a measurement error in the phase current, which is in the tolerance range, cannot be detected in this way. Since a maximum permissible error must be taken into account in each case for all phase currents and the phase currents are added to form a phase current sum, the maximum permissible error also adds up. This means that the maximum permissible error in the phase current sum corresponds to the sum of the maximum permissible errors of the individual phase currents. The permissible error in the phase current sum increases in a proportionally linear manner together with the number of phases (and thus the number of phase currents to be determined). The high maximum permissible error in the phase current sum results in a low level of accuracy when validating the phase currents, since this level of accuracy deteriorates in a linear manner together with the number of phases.

In particular in the case of a large number of phases, the permissible error in the phase current sum can thus reach such high values that it is not possible to meaningfully validate the phase currents on the basis of the phase current sum, which means that safe operation of the multi-phase system cannot be ensured.

The problem addressed by the present invention is therefore that of providing a method for the safe operation of a multi-phase system even having a large number of phases.

According to the invention, this problem is solved by providing a number of phase groups which comprise some of the phases, the phase currents of the number of phase groups being merged in a group node to form a group sum current, and by a group sum current measurement value of the group sum current being captured by a group current sensor, the current measurement values associated with the number of phase groups being summed up by a group summation unit to form a group sum, and the group sum being compared with the group sum current measurement value by a group comparison unit to validate the phase currents of the phases in order to ensure safe operation of the multi-phase system.

Furthermore, the problem is solved by a multi-phase system in which a number of phase groups is provided which comprises some of the phases, a group node being provided, in which the phase currents of the number of phase groups are merged to form a group sum current, a group current sensor being provided for detecting a group sum current measurement value of the group sum current, a group summation unit being provided, which is designed to sum up the current measurement values of the phase currents belonging to the number of phase groups to form a group sum, a group comparison unit being provided, which is designed to compare the group sum with the group sum current measurement value to validate the phase currents of the phases in order to ensure safe operation of the multi-phase system.

When determining a current measurement value of a phase current, a maximum deviation of the current measurement value from the actual phase current must be taken into account in the form of a maximum permissible error. According to the invention, some of the phases are merged in at least one phase group in a group node, which results in a group sum current for the respective phase currents in the group node. Furthermore, the current measurement values of the phases belonging to the at least one phase group are summed up to form a group sum. For the group sum, this results in a maximum permissible error as sum of the permissible errors in the phases contained in the particular phase group. Furthermore, the group sum is compared with the group sum current measurement value in order to validate the phase currents of the phase group.

If, instead, all the phases of the multi-phase system were to be merged to form a total sum current in a total node and the current measurement values of all the phases were added up to a total sum, the maximum permissible error would be the sum of the permissible errors of all the phases.

According to the invention, combining some of the phases into a phase group results in a maximum permissible error in the group sum current measurement value, which is less than it would be for the total sum current measurement value. This allows the phase currents to be validated with greater accuracy. This means that the tolerance for the deviation from the group sum current to the group sum current measurement value is lower, which means that smaller errors can also be detected during validation. By combining phases into phase groups, the accuracy of the validation is independent of the number of phases or phase currents in the multi-phase system. This validation with a high level of accuracy can ensure safe operation of the multi-phase system. It is ensured with a low error tolerance that no, or only small, errors occur during the measurement and/or processing of the phase currents. If the validation fails, at least one action can be triggered by an action unit, for example an optical and/or acoustic signal can be output. Likewise, in the event of a failed validation, the multi-phase system or part of it can be shut down as an action. As an action, for example, the multi-phase system can also be prevented from switching on. A signal can also be generated as an action, which signal is processed further, for example by a control unit of the multi-phase system.

The principle of forming phase groups to increase the accuracy of the safe determination of a phase current can be applied to any physical measuring principles for current measurement and can also be used in inhomogeneous systems involving a different current measurement. Phase groups can thus be formed independently of the measuring principle used (use of shunts, use of the Hall effect, . . . ), it being possible to use the same or at least partially different measuring principles in the method according to the invention for measuring different currents.

Of course, in addition to the method according to the invention, all the phases can also be combined in a total node to form a total sum current, and a total sum current measurement value can be determined, which is compared with the sum of the current measurement values of all the phases. An (additional) validation based on the total sum current is, however, subject to a maximum permissible error as the sum of the maximum permissible errors of all the phases.

Preferably, the phase currents of all the phases of the multi-phase system are divided into a number of phase groups, in each phase group the phase currents are merged in a group node to form a group sum current and a group sum current measurement value of the group sum current is captured, the current measurement values of the phase currents in each phase group being summed up by a group summation unit to form a group sum, and, for each phase group, the group sums being compared with the associated group sum current measurement values by a group comparison unit to validate the phase currents of all the phases within the number of phase groups.

By dividing all the phases into phase groups, the phase currents of all the phases can be validated. For each phase group, this results in a maximum permissible error as the sum of the permissible errors of the phases contained in the particular phase group. Since each phase group comprises only some of the phases of the multi-phase system, the maximum permissible error in the phases contained in the phase group is thus a lower maximum permissible error in the validation than would be the case for a total sum current. Viewed as a whole, the accuracy of the validation of the phase currents of all the phases depends on the greatest maximum permissible error in the phase groups involved.

The number of phase groups can comprise the same number of phases. This results in a symmetrical and simple structure. The phase groups can also be nested within one another. However, each phase is preferably only comprised by one phase group, in particular if all the phases are divided into phase groups.

Phase groups having a different number of phases can also be provided. This can be particularly advantageous if different maximum permissible errors are to be expected when determining the current measurement values of the respective phases. This can be the case in particular when different sensors are used.

It can be advantageous if phases of which the current measurement values have a larger maximum permissible error are captured in smaller phase groups, i.e. phase groups having fewer phases, and phases of which the current measurement values have a smaller maximum permissible error are captured in larger phase groups, i.e. phase groups having more phases.

The current measurement values of the phase currents are preferably reliably captured in accordance with a predefined safety requirement, a single-fault security measure being preferably required as a safety requirement for determining the current measurement values.

If the current measurement values are determined by means of a sigma-delta conversion, this safety requirement can relate to an implementation in an FPGA; in the case of LEM converters, it can relate to an ADC converter.

The method according to the invention can be used in all multi-phase systems having a plurality of n>2 phases, in particular in long stator linear motors or planar motors. If all the phases of the multi-phase system are to be combined in phase groups, a plurality of n>3 phases is required.

In the case of a number of four phases, for example, two phase groups each having two phases can be provided.

In the following, the present invention shall be described in more detail with reference to the figures which, by way of example, show schematic and non-limiting advantageous embodiments of the invention. In the drawings.

Figure 1:
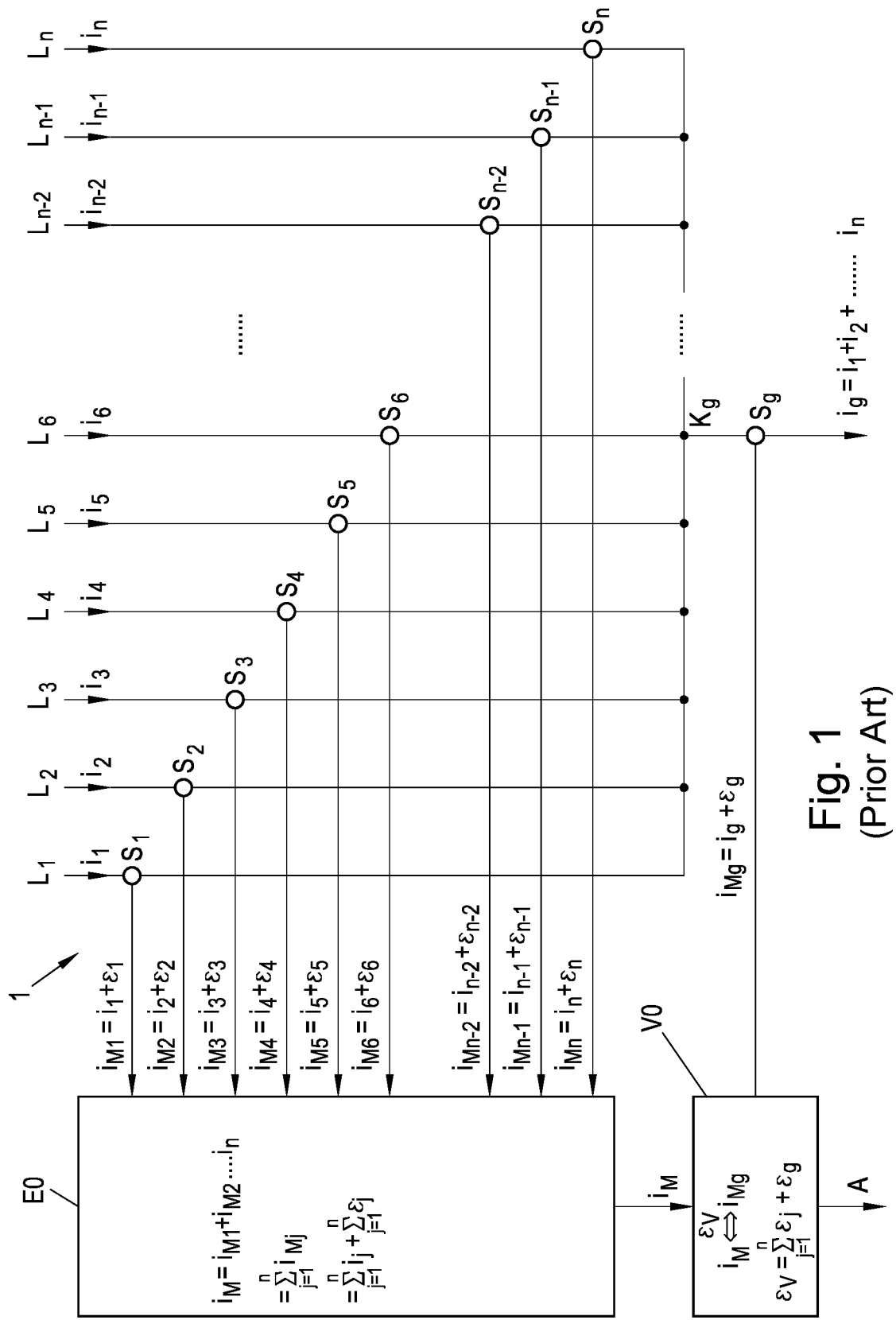
FIG. 1 shows a validation of the phase currents according to the prior art.

FIG. 1 shows a validation of n phase currents $i_1, \ldots, i_n$ of a multi-phase system 1 according to the prior art. The multi-phase system 1 can be, for example, an electromagnetic transport system, e.g. a long stator linear motor or planar motor, and comprises a plurality n of phases $L_1, \ldots, L_n$. A phase current $i_1, \ldots, i_n$ flows in each phase $L_1, \ldots, L_n$, a phase current sensor $S_1, \ldots, S_n$ being provided in each phase $L_1, \ldots, L_n$ to determine a current measurement value $i_{M1}, \ldots, i_{Mn}$ of the phase current $i_1, \ldots, i_n$. The individual current measurement values $i_{M1}, \ldots, i_{Mn}$ each have a maximum error $\varepsilon_1, \ldots, \varepsilon_n$ in relation to the actual phase current $i_1, \ldots, i_n$, e.g. due to system-related measurement errors. This maximum error $\varepsilon_1, \ldots, \varepsilon_n$ must be taken into account during validation. The first current measurement value $i_{M1}$ thus consists of the first phase current $i_1$ and a first maximum error $\varepsilon_1$: $i_{M1}=i_1+\varepsilon_1$; the second current measurement value $i_{M2}$ consists of the second phase current $i_2$ and a second maximum error $\varepsilon_2$: $i_{M2}=i_2 \varepsilon_2$, etc.; and the n-th current measurement value $i_{Mn}$ consists of the n-th phase current $i_n$ and an n-th maximum error $\varepsilon_n$: $i_{Mn}=i_n+\varepsilon_n$.

The maximum errors $\varepsilon_1, \ldots, \varepsilon_n$ themselves can each be assumed to be positive or negative, it being possible for an error tolerance band to also be assumed as the maximum possible error $\varepsilon_1, \ldots, \varepsilon_n$. A positive maximum error $\varepsilon_1, \ldots, \varepsilon_n$ means a maximum possible excess of the particular phase current $i_1, \ldots, i_n$ by the associated current measurement value $i_{M1}, \ldots, i_{Mn}$; a negative maximum error $\varepsilon_1, \ldots, \varepsilon_n$ means a maximum possible shortfall of the particular phase current $i_1, \ldots, i_n$ by the associated current measurement value $i_{M1}, \ldots, i_{Mn}$. A maximum error $\varepsilon_1, \ldots, \varepsilon_n$ as the tolerance band means that the maximum possible excess and/or shortfall of the particular phase current $i_1, \ldots, i_n$ is assumed by the associated current measurement value $i_{M1}, \ldots, i_{Mn}$. In a summation unit E0, the current measurement values $i_{M1}, \ldots, i_{Mn}$ are summed up to form a measurement value total sum $$i_M = \sum_{j=1}^{n} i_{Mj}.$$

The measurement value total sum $i_M$ thus comprises the sum of then phase currents $i_1, \ldots, i_n$, plus the sum of the maximum errors $\varepsilon_1, \ldots, \varepsilon_n$:

$$i_M = \sum_{j=1}^{n} i_{Mj} = \sum_{j=1}^{n} i_j + \sum_{j=1}^{n} \varepsilon_j.$$

Furthermore, the phase currents $i_1, \ldots, i_n$ are merged into a total node $K_g$ to form a sum current $i_g$, which results in the sum current $i_g = i_1 + i_2 + + i_n$. A sum current measurement value $i_{Mg}$ of the sum current $i_g$ is determined, in this case using a sum current sensor $S_g$, the sum current measurement value $i_{Mg}$ also having a maximum error $\varepsilon_g$, and thus the sum current $i_g$ and the maximum error $\varepsilon_g$ result in the following: $i_{Mg} = i_g + \varepsilon_g$.

In principle, positive maximum errors $\varepsilon_1, \ldots, \varepsilon_n$ and/or negative maximum errors $\varepsilon_1, \ldots, \varepsilon_n$ could be added separately, in particular if different values are assumed for the positive and negative maximum errors $\varepsilon_1, \ldots, \varepsilon_n$. If an error tolerance band is assumed as the maximum possible error $\varepsilon_1, \ldots, \varepsilon_n$, then a summation of the maximum errors $\varepsilon_1, \ldots, \varepsilon_n$ means expanding the error tolerance band. For ease of illustration, an addition of the maximum error $\varepsilon_1, \ldots, \varepsilon_n$ is only shown in a general manner. A summation of the maximum errors $\varepsilon_1, \ldots, \varepsilon_n$ can fundamentally take place for negative maximum errors $\varepsilon_1, \ldots, \varepsilon_n$ and/or for maximum errors $\varepsilon_1, \ldots, \varepsilon_n$ and/or for maximum errors $\varepsilon_1, \ldots, \varepsilon_n$ in the form of a tolerance band.

A comparison unit V0 now compares the measurement value total sum $i_M$ with the sum current measurement value $i_{Mg}$, the phase currents $i_1, \ldots, i_n$ being validated if there is a sufficiently precise match. If the validation fails, an action A is triggered, for example.

During validation, however, the maximum errors $\varepsilon_1, \ldots, \varepsilon_n$ of the current measurement values $i_{M1}, \ldots, i_{Mn}$ and the maximum error $\varepsilon_g$ of the sum current measurement value $i_{Mg}$ must be taken into account, as is shown in FIG. 1 in a general manner. The maximum errors $\varepsilon_1, \ldots, \varepsilon_n$ in the current measurement values $i_{M1}, \ldots, i_{Mn}$ with respect to the phase currents $i_1, \ldots, i_n$ are therefore included in the measurement value total sum $i_M$. When comparing the measurement value total sum $i_M$ with the sum current measurement value $i_{Mg}$ (shown as $i_M \Leftrightarrow i_{Mg}$ in FIG. 1), not only are the maximum error $\varepsilon_1, \ldots, \varepsilon_n$ of the current measurement values $i_{M1}, \ldots, i_{Mn}$ also taken into account, but also the maximum error $\varepsilon_g$ of the sum current measurement value $i_{Mg}$ with respect to the sum current $i_g$.

This results in a high maximum permissible total error $$\varepsilon_V = \varepsilon_1 + \varepsilon_2 + \ldots \varepsilon_n + \varepsilon_g = \sum_{j=1}^{n} \varepsilon_j + \varepsilon_g$$

for the validation of the phase currents $i_1, \ldots, i_n$, in particular in the case of a large number n of phases $L_1, \ldots, L_n$. Thus, an occurring error which causes the sum current measurement value $i_{Mg}$ to deviate from the total measurement value $i_M$ by less than the maximum permissible total error $$\varepsilon_V = \sum_{j=1}^{n} \varepsilon_j + \varepsilon_g$$

cannot be detected. This occurring error can relate to a phase current $i_1, \ldots, i_n$ or can accumulate from a plurality of occurring errors related to a plurality of phase currents $i_1, \ldots, i_n$.

Assuming that the maximum error $\varepsilon_1, \ldots, \varepsilon_n$ of the current measurement values $i_{M1}, \ldots, i_{Mn}$ and the maximum error $\varepsilon_g$ of the sum current measurement value $i_{Mg}$ each correspond to the identical maximum error $\varepsilon_1 = \varepsilon_2 = \ldots = \varepsilon_n = \varepsilon_x$ (not shown), the result for the total measurement value sum $i_M$ is the sum of the phase currents $i_1, \ldots, i_n$ plus the n-th maximum error $\varepsilon_x$: $i_M = i_1 + i_2 + \ldots + i_n + n \varepsilon_x$. In contrast, the sum current measurement value $i_{Mg}$ corresponds to the sum of the phase currents $i_1, \ldots, i_n$ plus the maximum error $\varepsilon_x$: $i_{Mg} = i_g + \varepsilon_x = +i_2 + \ldots + i_n + \varepsilon_x$. In order to be able to compare the total measurement value sum $i_M$ with the sum current measurement value $i_{Mg}$ $$\left(i_M \overset{\varepsilon_V}{\Longleftrightarrow} i_{Mg}\right),$$

a maximum permissible total error in the size of $\varepsilon_V = (n+1) \varepsilon_x$ must be taken into account as the error limit, the factor n originating from the determination of the current measurement values $i_{M1}, \ldots, i_{Mn}$ and corresponding to the number of phases $L_1, \ldots, L_n$ while the additional factor 1 is derived from the measurement of the sum current measurement value $i_{Mg}$.

This means that, during validation, an error that occurs which causes the sum current measurement value $i_{Mg}$ to deviate from the total measurement value sum $i_M$ by less than the maximum permissible total error $\varepsilon_V = (n+1) \varepsilon_x$ cannot be detected.

If a long stator linear motor which has, for example, a plurality of n=42 phases $L_1, \ldots, L_{n=42}$, is operated as a multi-phase system 1, then summing up the current measurement values $i_{M1}, \ldots, i_{Mn=42}$ to form a total measurement value sum $i_M$ and comparing with the sum current measurement $i_{Mg}$ of the sum current $i_g$ results in a maximum permissible total error of $\varepsilon_V = \varepsilon_1 + \varepsilon_1 + \ldots \varepsilon_{n=42} + \varepsilon_g$.

Assuming that the maximum error $\varepsilon_1, \ldots, \varepsilon_{n=42}$ in the current measurement values $i_{M1}, \ldots, i_{Mn=42}$ and the maximum error $\varepsilon_g$ of the sum current value $i_{Mg}$ each correspond to a maximum error $\varepsilon_x$ of 100 mA, the maximum permissible total error in $\varepsilon_V = (n+1) \varepsilon_x = 43 * 100$ mA=4.3 A. This means that during validation, individual errors that occur in current measurement values $i_{M1}, \ldots, i_{Mn}$, or even accumulative errors that add up to a total error that is less than the maximum permissible total error $\varepsilon_V = 4.3$ A are not detected.

Figure 2A:
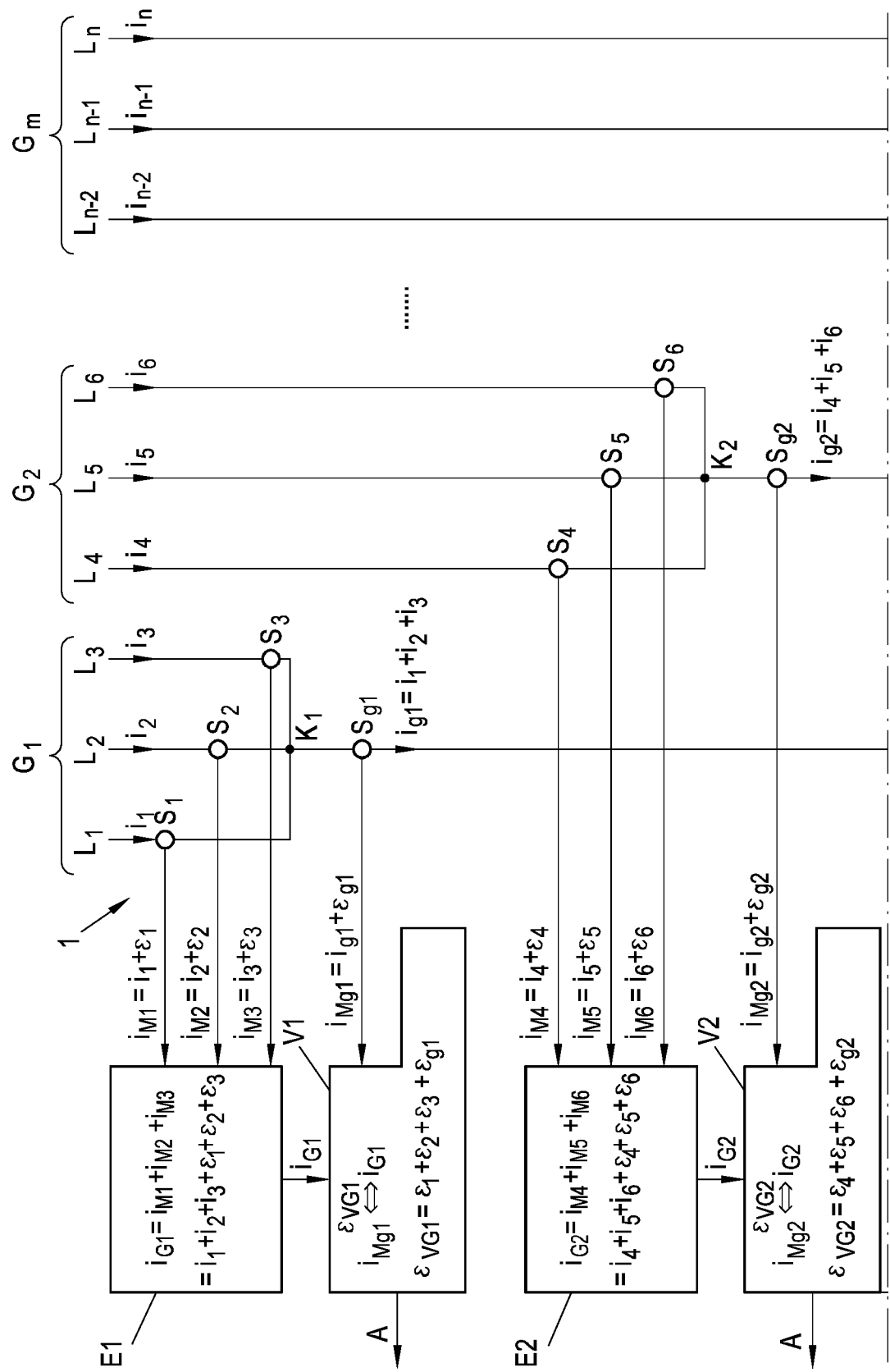
FIGS. 2A and 2B show a validation of the phase currents in respective phase groups.
Figure 2B:
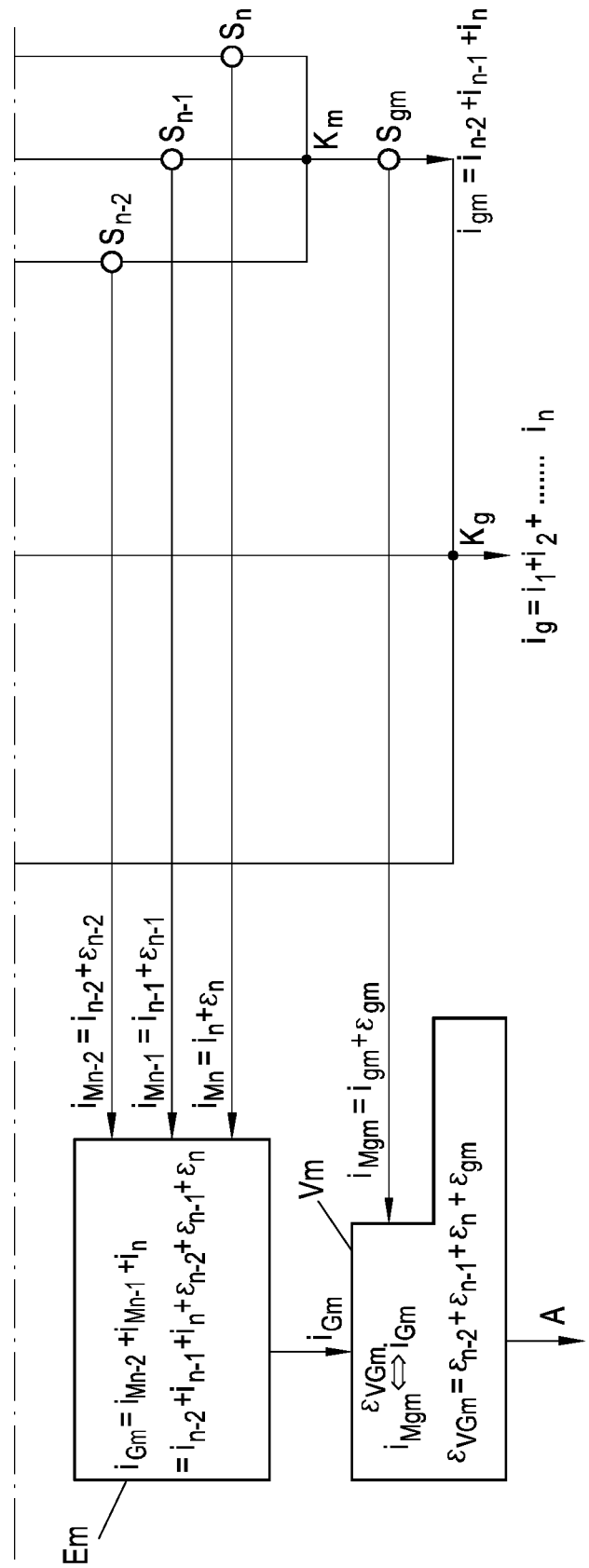

In contrast, FIGS. 2A and 2B show a preferred embodiment of the method according to the invention and the device according to the invention. A multi-phase system 1 having a plurality n of phases $L_1, \ldots, L_n$ is also shown, phase current sensors $S_1, \ldots, S_n$ being provided in each phase $L_1, \ldots, L_n$ for measuring the respective phase currents $i_1, \ldots, i_n$. A current measurement value $i_{M1}, \ldots, i_{Mn}$ is thus determined for each phase current $i_1, \ldots, i_n$. The individual current measurement values $i_{M1}, \ldots, i_{Mn}$, in turn, each have a maximum error $\varepsilon_1, \ldots, \varepsilon_n$. As described above with reference to FIG. 1, this results in the first phase current $i_1$ together with a first maximum error $\varepsilon_1$ for the first current measurement value $i_{M1}$: $i_{M1}=i_1+\varepsilon_1$, and the second phase current $i_2$ together with a second maximum error $\varepsilon_2$ for the second current measurement value $i_{M2}$: $i_{M2}=i_2+\varepsilon_2$, up to the n-th current measurement value $i_{Mn}$, which consists of the n-th phase current $i_n$ and an n-th maximum error $\varepsilon_n$: $i_{Mn}=i_n+\varepsilon_n$.

In contrast to FIG. 1, however, a plurality of m>1 phase groups $G_1, \ldots, G_m$ an are provided, each of which comprises some of the phases $L_1, \ldots, L_n$. According to the invention, each phase group $G_1, \ldots, G_m$ comprises some of the plurality n of phases $L_1, \ldots, L_n$. The number of phases $L_1, \ldots, L_n$ comprised by a phase group $G_1, \ldots, G_m$ is referred to in the following as the group phase number $p_1, \ldots, p_m$. The group phase number $p_1, \ldots, p_n$, of the phase groups $G_1, \ldots, G_m$ can be identical, or at least partially vary between the phase groups $G_1, \ldots, G_m$. In FIGS. 2A and 2B, each phase group $G_1, \ldots, G_m$ comprises three phases, so that the group phase number $p_1, \ldots p_n$, of each phase group $G_1, \ldots, G_m$ is three.

The number m of phase groups $G_1, \ldots, G_m$ in total can also comprise only some of the phases $L_1, \ldots, L_n$ of the multi-phase system 1. However, only this portion of the phases $L_1, \ldots, L_n$, of the particular phase current $i_1, \ldots, i_n$ are thus validated according to the invention.

In each phase group $G_1, \ldots, G_m$, the current measurement values $i_{M1}, \ldots, i_{Mn}$ of the associated phases $L_1, \ldots, L_n$ are each summed up by a group summation unit $E_1, E_2, \ldots, E_m$ to form a group sum $i_{G1}, \ldots, i_{Gm}$.

The group comparison units $V_1, \ldots, V_m$ and/or group summation units $E_1, E_2, \ldots, E_m$ can be an integral component of the multi-phase system, for example integrated on a control unit of the multi-phase system 1, e.g. of an electromagnetic transport system. The same applies to the action unit, if provided. The group comparison units $V_1, \ldots, V_m$ and/or group summation units $E_1, E_2, \ldots, E_m$ and/or action unit can each be designed as hardware or software.

For example, for the first phase group $G_1$, the first current measurement value $i_{M1}$, the second current measurement value $i_{M2}$ and the third current measurement value $i_{M3}$ are added up to form a first group sum $i_{G1}$, so that the first group sum $i_{G1}$ comprises the sum of the first, second and third phase currents $i_1, i_2, i_3$ plus the sum of the first, second and third maximum errors $\varepsilon_1, \varepsilon_2, \varepsilon_3$: $i_{G1}=i_1+i_2+i_3+\varepsilon_1+\varepsilon_2+\varepsilon_3$; the second group sum $i_{G2}$ comprises the sum of the fourth, fifth and sixth phase currents $i_4, i_5, i_6$ plus the sum of the fourth, fifth and sixth maximum error $\varepsilon_4, \varepsilon_5, \varepsilon_6$: $i_{G2}=i_4+i_5+i_6+\varepsilon_4+\varepsilon_5+\varepsilon_6$, etc.; and the m-th group sum $i_{Gm}$ comprises the sum of the n–2, n–1 and n-th phase currents $i_{n-2}, i_{n-1}, i_n$ plus the sum of the n–2, n–1 and n-th maximum errors $\varepsilon_{n-2}, \varepsilon_{n-1}, \varepsilon_n$: $i_{Gm}=i_{n-2}+i_{n-1}+i_n+\varepsilon_{n-2}+\varepsilon_{n-1}+\varepsilon_n$.

Furthermore, the phase currents $i_1, \ldots, i_n$ of each phase group $G_1, \ldots, G_m$ are merged in a group node $K_1, \ldots, K_m$ to form a group sum current $i_{g1}, \ldots, i_{gm}$, which results in the sum of the phase currents $i_1, \ldots, i_n$ contained in the group for the particular group sum current $i_{g1}, \ldots, i_{gm}$. Using a group current sensor $S_{g1}, \ldots, S_{gm}$, a group sum current measurement value $i_{Mg1}, \ldots, i_{Mgm}$ of the group sum currents $i_{g1}, \ldots, i_{gm}$ is determined, the group sum current measurement values $i_{Mg1}, \ldots, i_{Mgm}$ each also having a maximum error $\varepsilon_{g1}, \ldots, \varepsilon_{gm}$ with respect to the associated group sum currents $i_{g1}, \ldots, i_{gm}$.

For example, the first group sum current measurement value $i_{Mg1}$ of the first phase group $G_1$ consists of the first, second and third phase currents $i_1, i_2, i_3$ and the maximum error $\varepsilon_{g1}$, etc.

According to the invention, a group comparison unit $V_1, \ldots, V_m$ compares the group sum current measurement values $i_{Mg1}, \ldots, i_{Mgm}$ with the associated group sums $i_{G1}, \ldots, i_{Gm}$ (shown as $$i_{Mg1}\overset{\varepsilon_{VG1}}{\Longleftrightarrow}i_{G1}, i_{Mg2}\overset{\varepsilon_{VG2}}{\Longleftrightarrow}i_{G2}, \ldots, i_{Mgm}\overset{\varepsilon_{VGm}}{\Longleftrightarrow}i_{Gm}$$

in FIGS. 2A and 2B) to validate the phase currents $i_1, \ldots, i_n$.

If the validation fails, i.e. if the particular group sum current measurement value $i_{Mg1}, \ldots, i_{Mgm}$ differs from the associated group sum $i_{G1}, \ldots, i_{Gm}$, an action A can be triggered by an action unit (not shown). As an action, for example, an optical and/or acoustic signal can be output and/or at least part of the multi-phase system 1 can be shut down.

In turn, in each group comparison unit $V_1, \ldots, V_m$, the maximum error $\varepsilon_1, \ldots, \varepsilon_n$ in the current measurement values $i_{M1}, \ldots, i_{Mn}$ (over the group sum $i_{G1}, \ldots, i_{Gm}$) and the maximum error $\varepsilon_{g1}, \ldots, \varepsilon_{gm}$ in the particular group sum current measurement value $i_{Mg1}, \ldots, i_{Mgm}$ must be taken into account. The maximum permissible total group error $\varepsilon_{V1}, \varepsilon_{V2}, \ldots, \varepsilon_{Vm}$ in each phase group $G_1, \ldots, G_m$ thus comprises only the sum of the maximum errors $\varepsilon_1, \ldots, \varepsilon_n$ of the current measurement values $i_{M1}, \ldots, i_{Mn}$ of the phases $L_1, \ldots, L_n$ which are contained in the particular phase group $G_1, \ldots, G_m$, and the maximum error $\varepsilon_{g1}, \ldots, \varepsilon_{gm}$ in the associated group sum current measurement value $i_{Mg1}, \ldots, i_{Mgm}$.

Comparing the first group sum current measurement value $i_{Mg1}$ with the associated first group SUM $i_{G1}$ $$\left(i_{Mg1}\overset{\varepsilon_{VG1}}{\Longleftrightarrow}i_{G1}\right)$$

results in, for example, only a maximum permissible total group error $\varepsilon_{VG1}=\varepsilon_1+\varepsilon_2+\varepsilon_3+\varepsilon_{g1}$ for the first group G1; comparing the second group sum current measurement value $i_{Mg2}$ with the associated second group sum $$\left(i_{G2}{i_{Mg2}\overset{\varepsilon_{VG2}}{\Longleftrightarrow}i_{G2}}\right)$$

results in a maximum permissible total group error $\varepsilon_{VG2}=\varepsilon_4+\varepsilon_5+\varepsilon_6+\varepsilon_{g2}, \ldots$; comparing the m-th group sum current measurement value $i_{Mgm}$ with the associated m-th group sum $$i_{Gm}\left(i_{Mgm}\overset{\varepsilon_{VGm}}{\Longleftrightarrow}i_{Gm}\right)$$

results in a maximum permissible total group error $\varepsilon_{VGm}=\varepsilon_{n-2}+\varepsilon_{n-1}+\varepsilon_n+\varepsilon_{gm}$.

For the general case of a phase group Gy, this means that the maximum permissible total group error $\varepsilon_{Vgy}$ consists of the maximum errors of the phase group Gy:

$$\sum_{j}^{py}\varepsilon_j,$$

a group phase number $p_y$ of maximum errors being summed up, i.e. one per phase contained in the phase group Gy ($p_y$ is the group phase number of the phase group Gy), and the maximum error $\varepsilon_{g1}, \ldots, \varepsilon_{gm}$ of the group sum current measurement value $i_{Mgy}$ that belongs to the phase group $G_y$ being taken into account. The maximum permissible total group error $\varepsilon_{Vgy}$ for the phase group $G_y$ thus corresponds to $$\varepsilon_{VGy} = \sum_{j}^{py} \varepsilon_j + \varepsilon_{gy}.$$

The maximum permissible total group error $\varepsilon_{Vgy}$ is taken into account during validation, i.e. when comparing the group sum current measurement value $i_{Mg1}, \ldots, i_{Mgm}$ with the associated group sum $i_{G1}, \ldots, i_{Gm}$. The validation fails if the group sum current measurement value $i_{Mg1}, \ldots, i_{Mgm}$ deviates from the associated group sum $i_{G1}, \ldots, i_{Gm}$ by more than the maximum permissible total group error $\varepsilon_{Vgy}$.

It should be assumed again that the maximum errors $\varepsilon_1, \ldots, \varepsilon_n$ in the current measurement values $i_{M1}, \ldots, i_{Mn}$ and the maximum errors $\varepsilon_{g1}, \ldots, \varepsilon_{gm}$ in the group sum current measurement values $i_{Mg1}, \ldots, i_{Mgm}$ each correspond to the maximum error $\varepsilon_x$ (not shown). For the group sum $i_{G1}, \ldots, i_{Gm}$ of each phase group $G_1, \ldots, G_m$, the sum of the associated phase currents $i_1, \ldots, i_n$ plus a three-fold maximum error $\varepsilon_x$ (three-fold in this case, since the group phase number $p_1, p_2, \ldots, p_m$ is three) results in the following: $i_{G1}=i_1+i_2+i_3+3\ \varepsilon_x$, $i_{G2}=i_4+i_5+i_6+3\ \varepsilon_x$, $i_{Gm}=i_{n-2}+i_{n-1}+i_n+3\ \varepsilon_x$.

Furthermore, the sum of the phase currents $i_1, \ldots, i_n$ contained in the group $G_1, \ldots, G_m$ plus the maximum error $\varepsilon$ results in the following for the group sum current measurement values $i_{MG1}, \ldots, i_{Mgm}$ at the group node $K_1, \ldots, K_m$: $i_{Mg1}=i_{g1}+\varepsilon_x=i_1+i_2+i_3+\varepsilon_x$, $i_{Mg2}=i_{g2}+\varepsilon_x=i_4+i_5+i_6+\varepsilon_x, \ldots, i_{Mgm}=i_{gm}+\varepsilon_x=i_{n-2}+i_{n-1}+i_n+\varepsilon_x$. In order to be able to compare the group sums jam with the associated group sum current measurement values $i_{Mg1}, \ldots, i_{Mgm}$ for the purpose of validating the phase currents $i_1, \ldots, i_n$ in the phase groups $G_1, \ldots, G_m$, only one maximum permissible total group error $\varepsilon_{VG1}, \ldots, \varepsilon_{VG1}$ in the particular group $G_1, \ldots, G_m$ in the amount of $\varepsilon_{VG1}=(3+1)\ \varepsilon_x$, $\varepsilon_{VG2}=(3+1)\ \varepsilon_x, \ldots, \varepsilon_{VGm}=(3+1)\ \varepsilon_x$ must be taken into account for each group $G_1, \ldots, G_m$, the particular factor 3 corresponding to the group phases number $p_1, \ldots, p_n$, and originating from the determination of the current measurement value$_s$ $i_{M1}, \ldots, i_{Mn}$ of the phases contained in the particular group $G_1, \ldots, G_m$, the additional factor 1 originating from the determination of the group sum current measurement values $i_{Mg1}, \ldots, i_{Mgm}$.

If, as a comparison to the prior art, a long stator linear motor which has a plurality of n=42 phases $L_1, \ldots, L_n$ is operated in turn as a multi-phase system 1, then dividing the phases $L_1, \ldots, L_n$ into a number m=14 of phase groups $G_1, \ldots, G_m$=14 each having a group phase number $p_1, \ldots, p_m$=3 and a maximum error $\varepsilon_x$ of, for example, 100 mA per phase group $G_1, \ldots, G_m$ results in a maximum permissible total group error $\varepsilon_{VG1}, \ldots, \varepsilon_{VG14}$ of $\varepsilon_{VG1}, \ldots, \varepsilon_{VG14}=(p+1)=4*100$ mA=0.4 A.

This means that only individual errors smaller than the maximum permissible total group error $\varepsilon_{VG}=(p+1)\ \varepsilon_x=0.4$ A are not detected during validation. Thus, the validation according to the invention has a much higher accuracy than a validation via a sum current measurement value $i_{Mg}$ according to FIG. 1; in the example described it is higher by a factor of 10.75. The validation according to the invention thus has a high level of accuracy, and therefore safe operation of the multi-phase system 1 can be ensured.

The invention claimed is:

1. Method for safely operating a multi-phase system, wherein a phase current flows in each of a plurality of phases of the multi-phase system respectively, and wherein current measurement values of the phase currents are captured by phase current sensors in order to validate the phase currents, wherein a number of phase groups is provided, which comprises some of the phases, wherein the phase currents of the number of phase groups are merged in a group node to form a group sum current, and a group sum current measurement value of the group sum current is captured by a group current sensor, wherein the current measurement values belonging to the number of phase groups are summed up by a group summation unit to form a group sum, and wherein the group sum is compared with the group sum current measurement value by a group comparison unit to validate the phase currents of the phases in order to ensure safe operation of the multi-phase system.

2. Method according to claim 1, wherein the phase currents of all the phases of the multi-phase system are divided into a number of phase groups, and in each phase group the phase currents of the phase group are merged in a group node to form a group sum current and a group sum current measurement value of the group sum current is captured, wherein, in each phase group, the current measurement values of the phase currents will each be summed up by a group summation unit to form a group sum, and wherein, for each phase group, the group sums are each compared with the associated group sum current measurement values by a group comparison unit in order to validate the phase currents of all the phases.

3. Method according to claim 1, wherein the number of phase groups each comprises the same number of phases.

4. Method according to claim 1, wherein the current measurement values of the phase currents are safely captured in accordance with a specified safety requirement.

5. Method according to claim 1, wherein an action is triggered by an action unit in the event of a failed validation.

6. Method according to claim 5, wherein an optical and/or acoustic signal is output as the action and/or at least part of the multi-phase system is shut down.

7. Multi-phase system comprising a plurality of phases, wherein a phase current flows in each of the phases, wherein phase current sensors are provided for capturing current measurement values of the phase currents, wherein a number of phase groups is provided, which comprises some of the phases, wherein a group node is provided, within which the phase currents of the number of phase groups are merged to form a group sum current, wherein a group current sensor is provided for capturing a group sum current measurement value of the group sum current, in that a group summation unit is provided, which is designed to sum up the current measurement values of the phase currents belonging to the number of phase groups to form a group sum, and wherein a group comparison unit is provided, which is designed to compare the group sum with the group sum current measurement value to validate the phase currents of the phases in order to ensure safe operation of the multi-phase system.

8. Multi-phase system according to claim 7, wherein the number of phase groups comprises all the phases of the multi-phase system, the phase currents of the phase group are merged in a group node to form a group sum current in each phase group, in that a group summation unit is to proceed for each phase group, which is designed to sum up the current measurement values of the phase currents to form a group sum respectively, and wherein a group comparison unit is provided for each phase group, which is designed to compare the group sums with the associated group sum current measurement values respectively in order to validate the phase currents of all the phases.

9. Multi-phase system according to claim 7, wherein an action unit is provided, which is connected to the group comparison unit and is designed to trigger an action in the event of a failed validation.

10. Multi-phase system according to claim 9, wherein the action unit is designed to output an optical and/or acoustic signal and/or to shut down at least part of the multi-phase system.

* * * * *